US010338930B2

(12) United States Patent
Melton et al.

(10) Patent No.: US 10,338,930 B2
(45) Date of Patent: *Jul. 2, 2019

(54) DUAL-RAIL DELAY INSENSITIVE ASYNCHRONOUS LOGIC PROCESSOR WITH SINGLE-RAIL SCAN SHIFT ENABLE

(71) Applicant: Eta Compute, Inc., Westlake Village, CA (US)

(72) Inventors: Ben Melton, Thousand Oaks, CA (US); Bryan Garnett Cope, Austin, TX (US)

(73) Assignee: Eta Compute, Inc., Westlake Village, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/022,524

(22) Filed: Jun. 28, 2018

(65) Prior Publication Data
US 2019/0004812 A1    Jan. 3, 2019

Related U.S. Application Data

(60) Provisional application No. 62/526,897, filed on Jun. 29, 2017.

(51) Int. Cl.
| G06F 9/38 | (2018.01) |
| H03K 19/20 | (2006.01) |
| G06F 17/50 | (2006.01) |
| G06F 1/3203 | (2019.01) |
| H03K 19/00 | (2006.01) |

(52) U.S. Cl.
CPC .......... G06F 9/3871 (2013.01); G06F 1/3203 (2013.01); G06F 17/5059 (2013.01); H03K 19/0008 (2013.01); H03K 19/20 (2013.01)

(58) Field of Classification Search
None
See application file for complete search history.

(56) References Cited

U.S. PATENT DOCUMENTS

2010/0185909 A1* 7/2010 Li .................... G01R 31/31854
714/726

* cited by examiner

*Primary Examiner* — Jany Richardson
(74) *Attorney, Agent, or Firm* — SoCal IP Law Group LLP; Steven C. Sereboff; Angelo Gaz

(57) ABSTRACT

There is disclosed a self-timed processor. The self-timed processor includes combinatorial logic comprising multi-rail delay insensitive asynchronous logic (DIAL) to output one or more multi-rail data values to a multiplexer. It also includes a test pattern input to output a test pattern bit stream of multi-rail test data values to the multiplexer. The multiplexer has Boolean logic to output one or more multi-rail multiplexed values to a latch. The multiplexer also has a single rail selector input to select whether the multi-rail multiplexed values are the multi-rail data values or the multi-rail test data values.

16 Claims, 6 Drawing Sheets

| tSH | fSH | tDA | fDA | tSC | fSC | 220 Output tMux | fMux |
|---|---|---|---|---|---|---|---|
| 0 | 1 | 0 | 0 | x | x | null | null |
| 0 | 1 | 1 | 0 | x | x | 1 | 0 |
| 0 | 1 | 0 | 1 | x | x | 0 | 1 |
| 0 | 1 | 1 | 1 | x | x | ill | ill |
| 1 | 0 | x | x | 0 | 0 | null | null |
| 1 | 0 | x | x | 1 | 0 | 1 | 0 |
| 1 | 0 | x | x | 0 | 1 | 0 | 1 |
| 1 | 0 | x | x | 1 | 1 | ill | ill |
| 0 | 0 | x | x | x | x | H | H |
| 1 | 1 | x | x | x | x | ill | ill |

"x" = irrelevant/any value
"null" = null value (0,0)
"ill" = illegal value – no change
"H" = hold previous state

| SHE | tDA | fDA | tSC | fSC | 320 Output | |
|---|---|---|---|---|---|---|
| | | | | | tMux | fMux |
| 0 | 0 | 0 | x | x | null | null |
| 0 | 1 | 0 | x | x | 1 | 0 |
| 0 | 0 | 1 | x | x | 0 | 1 |
| 0 | 1 | 1 | x | x | ill | ill |
| 1 | x | x | 0 | 0 | null | null |
| 1 | x | x | 1 | 0 | 1 | 0 |
| 1 | x | x | 0 | 1 | 0 | 1 |
| 1 | x | x | 1 | 1 | ill | ill |

"x" = irrelevant/any value
"null" = null value (0,0)
"ill" = illegal value – no change

DUAL-RAIL DELAY INSENSITIVE ASYNCHRONOUS LOGIC PROCESSOR WITH SINGLE-RAIL SCAN SHIFT ENABLE

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

RELATED APPLICATION INFORMATION

This patent claims priority from provisional patent application 62/526,897, filed Jun. 29, 2017, titled DUAL-RAIL NCL PROCESSOR WITH SINGLE-RAIL SCAN SHIFT ENABLE.

BACKGROUND

Field

This disclosure relates to asynchronous digital logic circuits.

Description of the Related Art

In this patent, the term "processor" means a digital circuit that performs some function. A processor may typically, but not necessarily, execute stored instructions to accomplish its assigned function. A processor as referred to herein may be a microprocessor, a microcontroller, a digital signal processor, a graphic processor, a coprocessor, a network processor, or some other type of processor. Most digital processors in use today are synchronous, which is to say various elements within the digital processor operate synchronously in response to a common clock signal. The power consumption of a synchronous processor depends on the complexity of the processor (i.e. the number of gates and other functional elements), the clock rate, and the operating voltage. In general, higher operating speed requires higher operating voltage. To minimize the power consumption of a synchronous digital logic circuit, the circuit may be operated at the lowest possible clock rate consistent with the circuit function and the lowest voltage that will support operation at that clock rate. The methodology and tools for designing synchronous logic circuits are well developed, so long as the processor circuit is designed to operate from a power supply voltage substantially above the threshold voltage of the transistors comprising the processor. However, to achieve the lowest possible power consumption, it may be preferable to operate a digital logic circuit at a voltage near or below the transistor threshold voltage. While research papers have shown that near-threshold operation of synchronous processors (i.e., operation with a power supply voltage near the transistor threshold voltage) may be possible, the delay of near-threshold and below-threshold logic gates may vary by a factor of up to 100 over an operating temperature range, and may vary by a factor of five or more between gates at a single temperature. As a consequence, it is difficult, if not impossible, to estimate the minimum required clock frequency for near-threshold voltage operation of synchronous logic circuits.

Asynchronous, or self-timed, processor circuits do not operate from a common clock signal, such that the delay of a self-timed processor is determined solely by the cumulative delay of the gates and other logic elements within the self-timed processor. Self-timed processors are typically operated in a cyclic manner. A cycle is initiated when input data is provided to the processor. The processor then performs some operation upon the input data, with the time required to perform the operation determined by the accumulated delays of the logic circuits within the processor. When the operation is complete and all of the outputs of the processor have assumed their final values, a feedback or acknowledge signal may be generated to indicate completion of the current cycle and readiness to begin the next cycle.

Delay insensitive asynchronous logic (DIAL) is a delay-insensitive logic paradigm in which each logical value has three defined states: "1", "0", and "null", where the null state indicates that a valid value is not yet available. In contrast, Boolean logic has two defined states: "1" and "0". A DIAL processor is typically operated in a cyclical manner. All of the inputs to a DIAL processor are initially set to the null state, which then propagates through the processor until all of the outputs of the processor assume the null state. This may be referred to as the "propagate null" phase of the processor cycle. The inputs are then set to valid Boolean values, which then propagate through the processor until all of the outputs also assume valid states. This may be referred to as the "propagate data" phase of the processor cycle. When all of the outputs have assumed valid states, the cycle is complete and the acknowledge signal is provided from the output side of the processor to the input side to request initiation of the next cycle.

Dual-rail DIAL logic uses two signals or rails, each of which has two possible values (1 or 0), to represent each Boolean variable. Typically, a Boolean "1" state is represented by (1,0), a Boolean "0" state is represented by (0,1), the null state is represented by (0,0), and (1,1) is forbidden. In some descriptions, the two signals will be referred to as the "true" and "false" rail. For a Boolean variable "A", the two rails will be designated as $t\_A$, and $f\_A$. A Boolean "1" or "true" state is represented by $t\_A=1$, $f\_A=0$, and a Boolean "0" or "false" state is represented by $t\_A=0$, $f\_A=1$. Either of these may be called "valid" or "valid states". The null state is represented by $t\_A=\_A=0$. The state $t\_A=f\_A=1$ is forbidden. Another form of DIAL uses four rails or signals to collectively represent two Boolean variables. The term "multi-rail" may encompass dual-rail and/or four-rail implementations of DIAL. The term "single-rail" may mean a conventional binary or Boolean value with two defined states: "1" and "0".

A subset of DIAL logic is null convention logic (NCL) which may partially or exclusively use threshold gates to perform the NCL logic functions.

Threshold gates are a type of logic gate, where "gate" is defined as a logic circuit having two or more inputs combined into a single output. The output of a threshold gate is set to 0 only when all of its inputs are 0. The output of a threshold gate is set to 1 when a predetermined combination of inputs are all 1. With other combinations of inputs, the output of the threshold gate retains its previous value. A nomenclature commonly used to describe some types of threshold gates is "THmn", where "TH" indicates the gate uses "threshold" logic; and n and m are integers. "n" is the number of inputs to the gate, and "m" is the number of inputs that must be 1 for the output of the gate to switch to 1.

Another type of threshold gate is referred to as a weighted threshold gate, denoted as THmnWw1w2 . . . wR. Weighted threshold gates have an integer value, m≥wR>1, applied to inputR. Here 1≤R<n; where n is the number of inputs; m is the gate's threshold; and w1, w2, . . . wR, each >1, are the integer weights of input1, input2, . . . inputR, respectively. For example, consider the TH33W2 gate, whose n=3 inputs are labeled A, B, and C. The weight of input A, W(A), is 2, and the gate's threshold, m, is 3, which implies that in order for the output to be asserted, either inputs A, B and C must all be asserted, or input A must be asserted along with any other input, B or C. Simplifying, for the output to be asserted, A must be asserted along with any other input, B or C; or the output is AB+AC.

Design for test (DFT) is a discipline commonly used during the design of processors and other complex integrated circuits to ensure testability during production. DFT incorporates additional circuitry into the integrated circuit design to facilitate testing. A common DFT technique is to add circuitry to allow flip-flops and other data storage elements within the integrated circuit to be linked into one or more contiguous shift registers. During test, a bit stream called a "test pattern" is serially shifted into the registers to test the registers for proper functionality and output.

The integrated circuit is then operated normally for one or more clock cycles, and the data in the registers is shifted serially out of the integrated circuit (typically while shifting another test patter into the register) and compared to an expected output result. Shifting data in and out of the registers is referred to as a "scan" of the integrated circuit. Test patterns and expected output results may be generated by an open-source, commercially-available, or proprietary automated test pattern generator (ATPG) software tool.

DESCRIPTION OF THE DRAWINGS

FIG. 3B shows a truth table summarizing the operation of the circuits of FIG. 3A.

Throughout this description, elements appearing in figures are assigned three-digit reference designators, where the most significant digit is the figure number where the element is introduced and the two least significant digits are specific to the element. An element that is not described in conjunction with a figure may be presumed to have the same characteristics and function as a previously-described element having the same reference designator.

DETAILED DESCRIPTION

Asynchronous, or self-timed, processors implemented using delay insensitive asynchronous logic (DIAL) may include design for test (DFT) additional circuitry to ensure testability during production.

Description of Apparatus

Figures 1A, 1B:
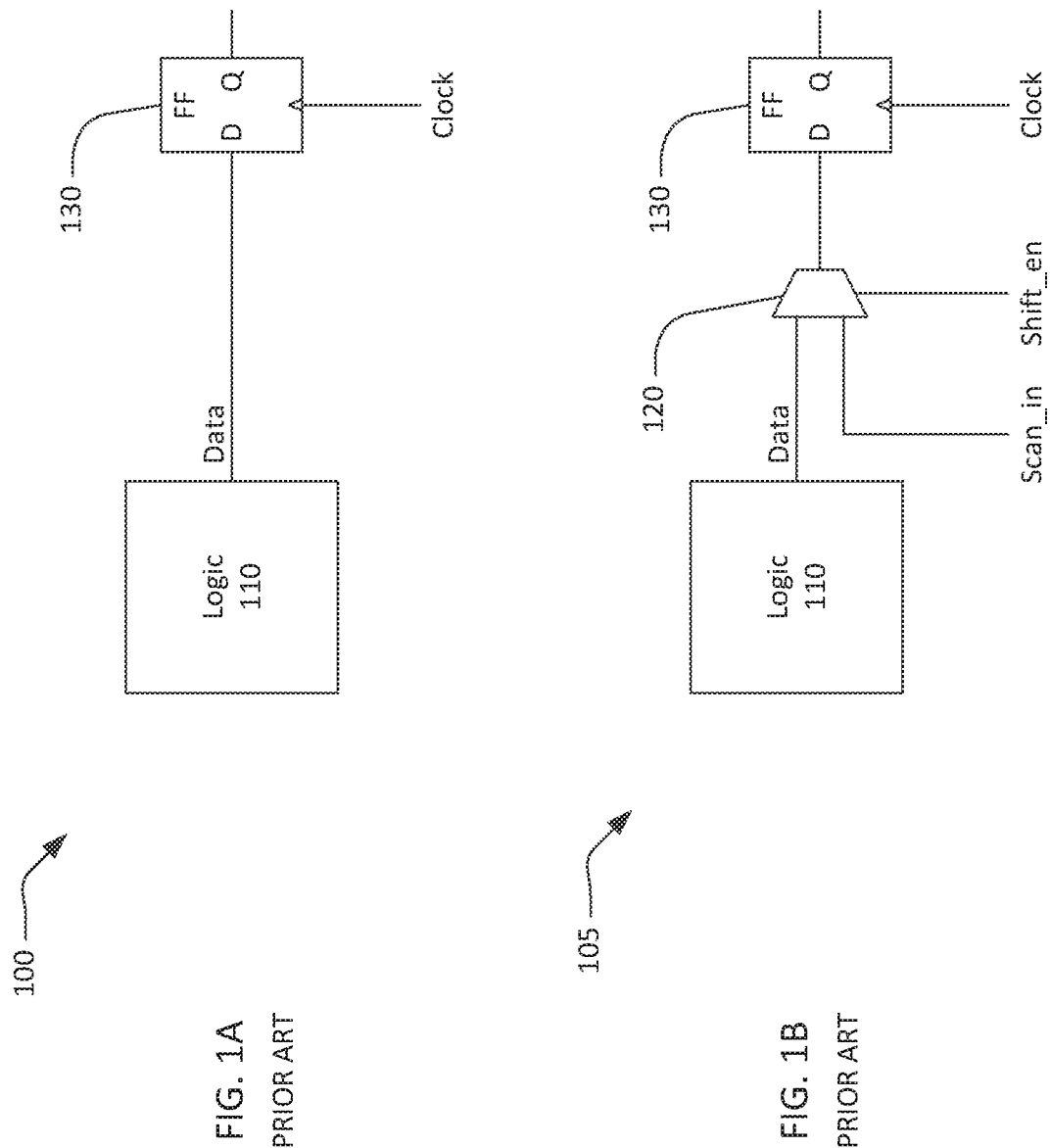
FIG. 1A is a block diagram of a portion of a conventional synchronous processor.
FIG. 1B is a block diagram of the portion of a conventional synchronous processor shown in FIG. 1A with added design for test (DFT) circuitry.

FIG. 1A is a block diagram of a circuit 100, which may be a small portion of a synchronous processor. The synchronous processor may have multiple instances of circuit 100. The circuit 100 has a clocked flip-flop (FF) 130 that stores a Boolean value "Data" provided by combinatorial logic 110, such as data to be input to the FF 130 during use of the processor to perform data processing and/or mathematical calculations. The FF 130 has an input data D for receiving values of Data, an output data Q, and a clock input Clock.

The operation of the FF 130 is synchronized by a clock signal Clock. The value Data is accepted by, or loaded into, the input data D on an active edge (i.e. either the rising edge or the falling edge) of the clock signal Clock. After a delay, output data Q is available at the output. In this context, the phrase "accepted by" means a signal is captured or held by the FF 130.

FF 130 may represent data storage elements within the integrated circuit other than a flip-flop. It may be a latch or register within a memory or processor. It may represent a pipeline of multiple of such data storage devices. In FIG. 1A, the input signals to and output data from the FF 130 are single rail, binary data.

FIG. 1B is a block diagram of a circuit 105, which may be a small portion of the synchronous processor with the addition of design for test (DFT) circuitry. The synchronous processor may have multiple instances of circuit 105. The circuit 105 has the clocked FF 130, the logic 110, and a multiplexer 120 inserted between the FF 130 and the logic 110. The multiplexer 120 may be DFT circuitry added to the processor for testing FF 130 to ensure testability during production.

The multiplexer 120 receives both the Boolean value "Data" provided by combinatorial logic 110 to be input to the FF 130 during use of the processor, and a Boolean value "Scan_in" for testing the FF 130, such as during the design of the processor.

Scan_in may be a bit stream or "test pattern" to be serially shifted into the FF 130 to test the FF 130. "Scan_in" may be received at an external input to the processor or circuit 105. In some cases, it may be an output from another flip-flop within the processor.

The multiplexer 120 also receives Boolean value "Shift_en" for selecting between using or testing FF 130. That is, the multiplexer 120 selects, based on a Boolean shift enable input ("Shift_en"), to output either "Data" or "Scan_in". The "Shift_en" value or signal may be received from a tester device that is external to the processor or chip having the circuit 105; and may be used to select between shift or capture when the processor or chip is in testmode or being tested. For instance, after the test pattern is accepted by the latch 130, "Shift_en" can be flopped in circuit 105 to cause the latch to output data at Q to be captured and compared by the tester device or manually to expected results for the test pattern input to determine if the latch 130 is operating properly.

In one example, when "Shift_en" is de-asserted, "Data" flows through the multiplexer 120 to be processed by FF 130, and the circuit 105 has the same logical function as the circuit 100. Here, FF 130 is being used similar to in circuit 100 but with the added propagation delay, power consumption and chip area of the added multiplexer 120 in circuit 105.

In this example, when "Shift_en" is asserted, "Scan_in" flows through the multiplexer 120 to be processed by FF 130, and the circuit 105 has the logical function of testing the FF 130 with "Scan_in". Here, FF 130 is being tested and as compared to circuit 100, circuit 105 still experiences the added propagation delay, power consumption and chip area of the added multiplexer 120 in circuit 105.

In some cases, when "Shift_en" is asserted, "Scan_in" flows through the multiplexer 120, typically linking multiple FFs such as FF 130 to form a shift register to receive test patterns such as Scan_in during a scan of the processor. In FIG. 1B, the output data from and input signals to the multiplexer 120 and the FF 130 are single rail, binary data.

Figure 2A:
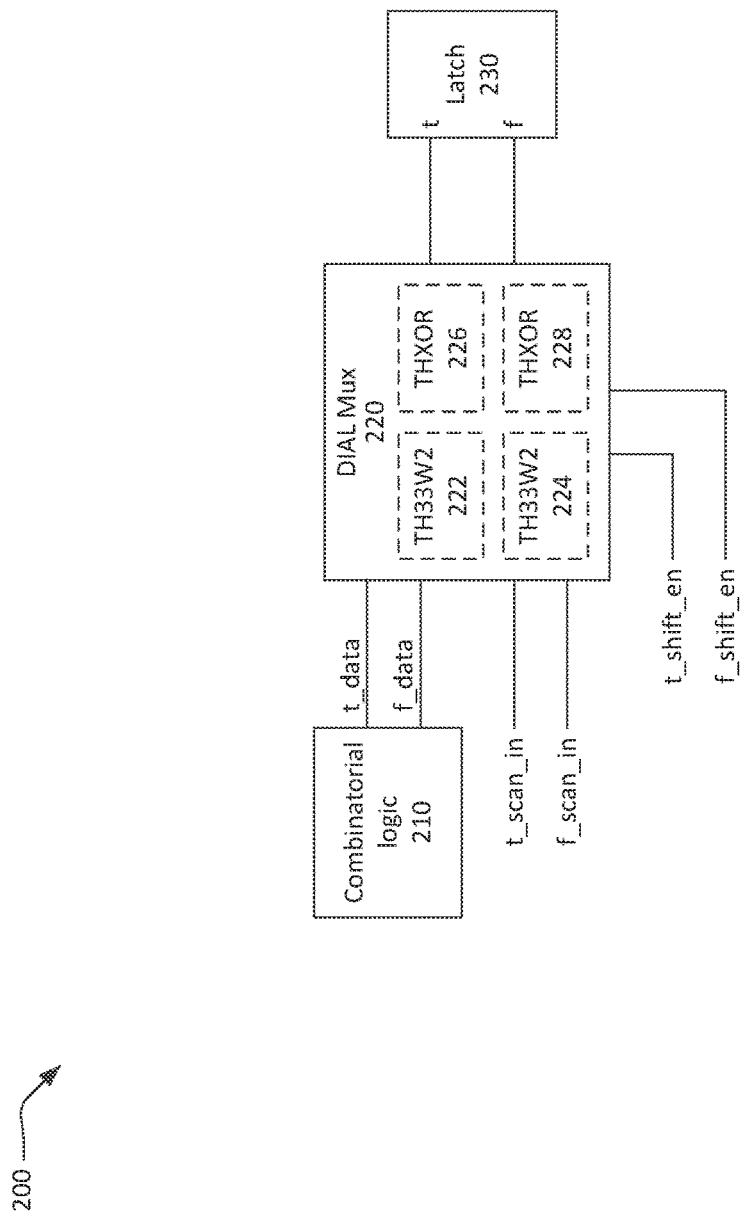
FIG. 2A is a block diagram of a portion of an asynchronous or self-timed processor having additional DFT circuitry implemented with dual-rail selector input logic.

FIG. 2A is a block diagram of a circuit 200, which may be a small portion of an asynchronous or self-timed processor having addition of DFT circuitry. The circuit 200 may be a portion of a self-timed dual-rail DIAL processor having multiplexer 220 implemented with dual-rail selector input logic signals (t_shift_en, f_shift_en). The asynchronous processor may have multiple instances of circuit 200.

The circuit 200 has a self-timed (e.g., non-clocked) latch 230, a self-timed combinatorial logic 210, and a self-timed delay insensitive asynchronous logic (DIAL) multiplexer 220 inserted between the latch 230 and the logic 210. The multiplexer 220 may be DFT circuitry added to the processor for testing latch 230 to ensure testability during production.

The circuit 200 may be the result of converting the circuit 105 of FIG. 1B to a self-timed dual-rail delay insensitive asynchronous logic (DIAL) circuit. Specifically, Boolean value "Data" provided by combinatorial logic 110, "Scan_in" for testing FF 130 and "Shift_en" for selecting between using or testing FF 130 of FIG. 1B are converted to dual-rail DIAL values in FIG. 2A.

In addition, the multiplexer 120 of FIG. 1B is converted to the dual-rail DIAL multiplexer 220 made up of two TH33W2 threshold gates and two THXOR threshold gates for selecting between using and testing latch 230 in FIG. 2A. As noted, multiplexer 220 is also controlled dual-rail selector input logic signals or values (t_shift_en, f_shift_en). The multiplexer 220 may be thought of as a dual-rail DIAL multiplexer 220 because it uses threshold logic gates or elements (e.g., TH gates as shown) to perform its multiplexing function of selecting for signals "data" or "scan_in". The multiplexer 220 may also be thought of as being controlled by dual-rail DIAL or a dual-rail selector input because dual-rail DIAL values "shift_en" control the selection of outputting dual-rail DIAL logic signals "data" or "scan_in".

Combinatorial logic 210 outputs DIAL values "data" on two rails, "t_data", "f_data" to true "t" and false "f" inputs the multiplexer 220 for receipt by latch 230 during use of the processor to perform data processing and/or mathematical calculations. The DIAL values of "data", (t_data, f_data) may have three possible values: (0,0)=null, (1,0)=one, and (0,1)=zero.

The multiplexer 220 also receive at true "t" and false "f" inputs, DIAL values "scan_in" on two rails, "t_scan_in", "f_scan_in" for receipt by latch 230 during testing of the processor, such as during the design of the processor. The DIAL values of "scan_in", (t_scan_in, f_scan_in) may have three possible values: (0,0)=null, (1,0)=one, and (0,1)=zero.

DIAL values (t_scan_in, f_scan_in) may be a bit stream or "test pattern" of synchronized DIAL values (t_scan_in, f_scan_in) on two rails to be serially shifted into the true "t" and false "f" inputs of latch 230, respectively, to test the latch 230. The DIAL values of "scan_in", (t_scan_in, f_scan_in) may be received at an external input to the processor or circuit 200. In some cases, they may be an output from another flip-flop within the processor.

The multiplexer 220 also receives on true "t" and false "f" inputs, DIAL values "shift_en" for selecting between using or testing latch 230. The DIAL values of "shift_en", (t_shift_en, f_shift_en) may have three possible values: (0,0)=null, (1,0)=one, and (0,1)=zero. That is, the multiplexer 220 selects, based on a dual rail DIAL shift enable input ("shift_en"), to output either DIAL values "data" or "scan_in" to the latch 230.

In one example, when DIAL values "shift_en" are de-asserted (e.g., are (0,1)), DIAL values "data" flow through the multiplexer 220 to be processed by the latch 230. Here, the circuit 200 has the logical function of inputting DIAL values of "data" into the latch 230 during use of the processor to perform data processing and/or mathematical calculations.

In this example, when DIAL values "shift_en" are asserted (e.g., are (1,0)), DIAL values "scan_in" flow through the multiplexer 220 to be processed by the latch 230. Here, the circuit 200 has the logical function of testing the latch 230 with DIAL values "scan_in".

The circuit 200 has the self-timed latch 230 that accepts and/or stores the dual-rail DIAL values "data" or "scan_in" provided by multiplexer 220 to the true "t" and false "f" inputs of latch 230. In this context, the phrase "accepts" means the dual-rail DIAL values "data" or "scan_in" are captured or held by the latch 230.

Latch 230 may represent data storage elements within the integrated circuit other than a latch or flip-flop. It may be a latch or register within a memory or processor. It may represent a pipeline of multiple of such data storage devices.

In some cases, when the dual-rail DIAL values "shift_en" are asserted, "scan_in" flows through the multiplexer 220, typically linking multiple latches such as latch 230 to form a shift register to receive test patterns of the dual-rail DIAL values "scan_in" during a scan of the processor. In FIG. 2A, all of the input signals to and output data from the multiplexer 220 and latch 230 are dual-rail, DIAL values or signals.

Figure 2B:
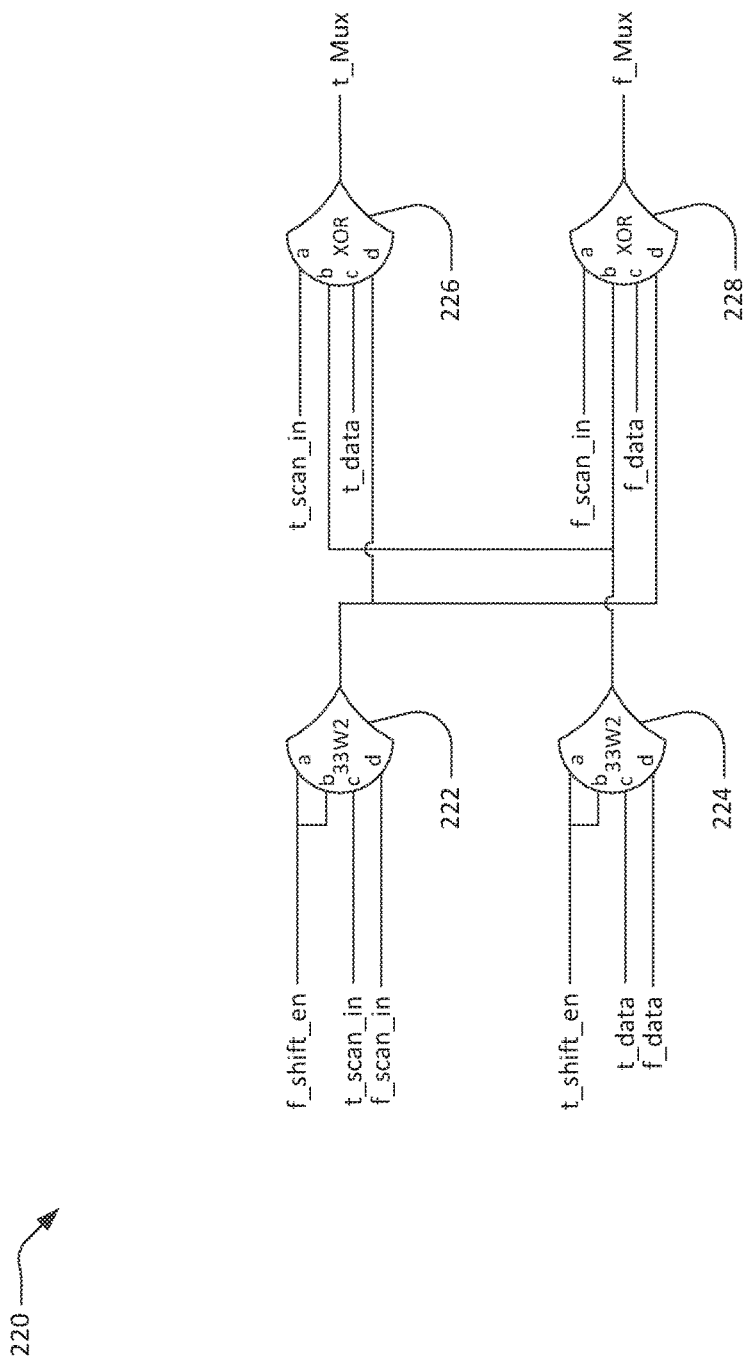
FIG. 2B shows an example of threshold gates that form the dual-rail delay insensitive asynchronous logic (DIAL) multiplexer of FIG. 2A.

FIG. 2B shows an example of threshold gates 222, 224, 226 and 228 that form the dual-rail DIAL multiplexer 220 of FIG. 2A. For inputs a=b, c and d of the threshold 33W2 gates 222 and 224 as shown, the outputs are ac+ad. That is, if ac=1, or ad=1 or both, then the output is =1. If ac=ad=0, then the output is 0. For inputs a, b, c and d of the threshold XOR gates 226 and 228 as shown, the outputs are ab+cd. Here, if ab=1, or cd=1 or both, then the output is =1. If ab=cd=0, then the output is 0. Based on the dual-rail NCF signals inputs, the multiplexer 220 outputs dual-rail NCF signals "data" or "scan_in" as noted in FIG. 2C and described below.

The first TH33W2 threshold gate 222 has true "t" and false "f" dual width (e.g., W2) input for f_shift_en; and single inputs for t_scan_in and f_scan_in. The output of gate 222 will be (f_shift_en)(t_scan_in)+(f_shift_en)(f_scan_in) and thus will be (1) whenever f_shift_en is (1) and either t_scan_in or f_scan_in are (1). The second TH33W2 threshold gate 224 has true "t" and false "f" W2 input for t_shift_en; and single inputs for t_data and f_data. It behaves similar to gate 222 but for these inputs.

The first THXOR threshold gate 226 has true "t" and false "f" single inputs for t_scan_in, the output of gate 224, t_data, and the output of gate 222. The output of gate 226 is t_Mux and will be (t_scan_in)(output of gate 224)+(t_data)

(output of gate 222). Thus, t_Mux will be (1) when t_shift_en is (1) after t_data or f_data were (1); and t_scan_in is (1), which is a switch from use to testing of the latch 230; and t_scan_in or t_data are true.

The second THXOR threshold gate 228 has true "t" and false "f" single inputs for f_scan_in, the output of gate 224, f_data, and the output of gate 222. The output of gate 228 is f_Mux and will be (f_scan_in)(output of gate 224)+(f_data) (output of gate 222). Thus, f_Mux will be (1) when f_shift_en is (1) after t_scan en or f_scan en were (1); and f_scan_in is (1), which is a switch from testing to use of the latch 230; and f_scan_in or f_data are true.

While multiplexer 220 is shown with the dual-rail TH33W2 and THXOR gates, it is considered that various other dual-rail controlled threshold logic can be used in place of those elements to perform the same function of selecting between outputting the received dual-rail DIAL logic signals "data" or "scan_in". For instance, while the multiplexer is shown implemented with TH33W2 and THXOR logic, any type of two-input dual-rail DIAL multiplexer may be used to have dual-rail DIAL "shift_en" control whether dual-rail DIAL "t_data" or "t_scan_in" is output. Such alternative dual-rail DIAL threshold logic may include threshold TH12, TH22, TH13, TH33, THAND, THCOMP and the like TH gates. It is considered that the multiplexer 220 could be implemented with other DIAL logic which may partially use or exclude use of threshold gates to perform the DIAL logic functions.

Figure 2C:
FIG. 2C shows a truth table summarizing the operation of the circuits of FIGS. 2A-2B.

FIG. 2C shows an example truth table 290 for the inputs and outputs of the dual-rail multiplexer 220 of FIG. 2A. Table 290 may summarize the operation of the circuits of FIGS. 2A-2B.

Table 290 shows true "t" and false "f" inputs to the multiplexer 220 of dual-rail DIAL values (t_shift_en, f_shift_en), (t_data, f_data), and (t_scan_in, f_scan_in) as (tSH, fSH), (tDA, fDA), and (tSC, fSC), respectively. Each dual-rail may have three possible values: (0,0)=null, (1,0) =one, and (0,1)=zero, with (1,1) being illegal. It also shows true "t" and false "f" outputs of the multiplexer 220 of dual-rail DIAL values (t_mux, f_Mux) as the "220 Output" values (tMux, fMux). In table 290, "x" represents an irrelevant value or any value (e.g., 1 or 0). In table 290, "null" represents the null value output, which is (0,0) that results from a null value (0,0) input. In table 290, "ill" represents an illegal or unused value output that results from an illegal value (1,1) input. The illegal value input causes no change in the output. In table 290, "H" represents a hold of a previous state value output that results from a null value (0,0) input. The null value input causes no change in the output. Table 290 shows that the DIAL values for the shift enable input ("shift_en") can be a dual-rail selector input to control whether multiplexer 220 will output either DIAL values "data" or "scan_in" to the latch 230.

As compared to circuit 100 of FIG. 1A, similar to the addition of the multiplexer 120 of FIG. 1B, the multiplexer 220 of FIG. 2A will add propagation delay, power consumption and chip area of the multiplexer 220 to circuit 200. In fact, the multiplexer 220 occupies a larger chip area, introduces longer propagation delay and causes more power consumption than the multiplexer 120. Significantly, many or all of the elements of the multiplexer 220 will switch cyclically as the self-timed processor of FIG. 2A cycles between the propagate data and propagate null phases. In circuit 200, the unnecessary cycling of the DFT circuitry may result in significant wasted power consumption. The added propagation delay, power consumption and chip area of the multiplexer 220 will be discussed further after the description of FIGS. 3A-B.

Figure 3A:
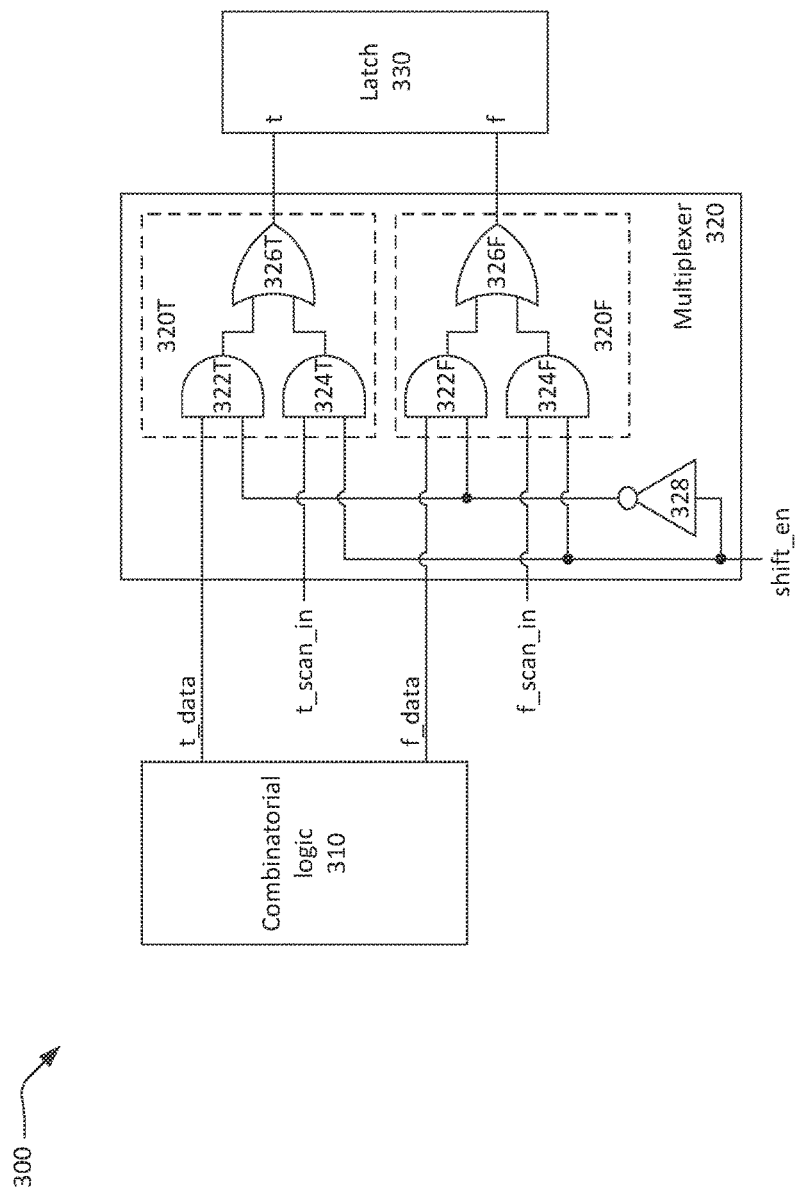
FIG. 3A is a block diagram of a portion of an asynchronous or self-timed processor having additional DFT circuitry implemented with single rail selector input logic.

FIG. 3A is a block diagram of a circuit 300, which may be a small portion of an asynchronous or self-timed processor having the addition of DFT circuitry. The circuit 300 may be a portion of a self-timed dual-rail DIAL processor having multiplexer 320 implemented with single rail selector input logic signal (shift_en). The asynchronous processor may have multiple instances of circuit 300.

The circuit 300 has the self-timed (e.g., non-clocked) latch 330, the self-timed combinatorial logic 310, and a self-timed Boolean logic multiplexer 320 inserted between the latch 330 and the logic 310. The multiplexer 320 may be DFT circuitry added to the processor for testing latch 330 to ensure testability during production.

The circuit 300 may be the result of partially converting the circuit 105 of FIG. 1B to a self-timed dual-rail DIAL circuit. Specifically, Boolean values "Data" provided by combinatorial logic 110 and "Scan_in" for testing FF 130 of FIG. 1B are converted to dual-rail DIAL in FIG. 3A. The converted versions of "Data" and "Scan_in" may be similar to those of FIG. 2A. For circuit 300, and "shift_en" is a Boolean (i.e. single-rail) value that controls or selects between using or testing latch 330. The dual-rail DIAL combinatorial logic 310, signals "scan_in" and the latch 330 may be the same as combinatorial logic 210, signals "scan_in" and the latch 230 of FIG. 2A, respectively.

In the example of FIG. 3A, the multiplexer 120 of FIG. 1B is converted to a multiplexer 320 made up of two, two AND-OR Boolean logic multiplexers 320T, 320F for selecting between using and testing the latch 330 in FIG. 3A. The multiplexer 320 includes receives dual-rail DIAL signals "data" and "scan_in"; and single rail Boolean signal "shift_en" for selecting between using and testing latch 330. The multiplexer 320 may be thought of as a Boolean logic multiplexer 320 because it includes Boolean logic gates or elements (e.g., inverter 328, AND gates and OR gates as shown) to perform its multiplexing function of selecting for signals "data" or "scan_in". In some cases, it only has Boolean logic elements.

The multiplexer 320 may also be thought of as being controlled by a Boolean logic and/or a single rail selector input because single rail Boolean logic value "shift_en" controls the selection of outputting dual-rail DIAL signals "data" or "scan_in". It is also noted that in the dual-rail DIAL multiplexer 220 the outputs of the first two TH33W2 gates are input to both of the second two THXOR gates creating a dual-rail mixed signal path. However, in single rail Boolean multiplexer 320 the outputs of the first two AND gates are only input to the OR gate of each of the multiplexers 320T and 320F thus forming separate single rail signal paths for each of the true and false data signals of "data" and "scan_in" in the multiplexer 320 as compared to the mixed signal paths in the multiplexer 220.

The combinatorial logic 310 outputs DIAL values "data" on two rails, "t_data", "f_data" to the multiplexer 320 for receipt by the latch 330 similar to as noted for the logic 210 and the multiplexer 220. The multiplexer 320 also receives DIAL values "scan_in" on two rails, "t_scan_in", "f_scan_in" for receipt by the latch 330 similar to as noted for the multiplexer 220 and the DIAL values of "scan_in" of FIGS. 2A-C. The DIAL values (t_scan_in, f_scan_in) may be a bit stream or "test pattern" of synchronized DIAL values as noted for "scan_in" of FIGS. 2A-C.

The multiplexer 320 also receives on a single rail selector input, Boolean value "shift_en" for selecting between using or testing the latch 330. The Boolean value (shift_en) may have two possible values: (1)=one, and (0)=zero. That is, the multiplexer 320 selects, based on a single rail Boolean shift enable input ("shift_en"), to output either DIAL values "data" or "scan_in" to the latch 330.

In one example, when Boolean value "shift_en" is de-asserted (e.g., is (0)), DIAL values "data" flow through the multiplexer 320 to be processed by the latch 330. Here, the circuit 300 has the logical function of inputting DIAL values of "data" into the latch 330 during use of the processor to perform data processing and/or mathematical calculations.

In this example, when Boolean value "shift_en" is asserted (e.g., is (1)), DIAL values "scan_in" flow through the multiplexer 320 to be processed by the latch 330. Here, the circuit 300 has the logical function of testing the latch 330 with DIAL values "scan_in".

The circuit 300 has a self-timed latch 330 that accepts and/or stores the dual-rail DIAL values "data" or "scan_in" provided by the multiplexer 320. The latch 330 accepting and/or storing the dual-rail DIAL values "data" or "scan_in" may be similar to as is described for FIG. 2A. The latch 330 may be the same latch as the latch 230.

In some cases, when the single-rail Boolean value "shift_en" is asserted, dual-rail values "scan_in" flow through the multiplexer 320, typically linking multiple latches such as latch 330 to form a shift register to receive test patterns of the dual-rail DIAL values "scan_in" during a scan of the processor.

FIG. 3A shows an example of two Boolean multiplexers 320T, 320F of the multiplexer 320. It also shows Boolean inverter 328 of the multiplexer 320 which outputs an input to AND gates 322T and 322F. For input a of the Boolean inverter 328, the output is the opposite or inverse of a. That is, if a=1, then the output is =0; and if a=0, then the output is 1. For inputs a and b of the Boolean AND gates 322T, 324T, 322F and 324F, the outputs are ab. That is, if a=b=1, then the output is =1. If a=0 or b=0, then the output is =0. For inputs a and b of the Boolean OR gates 326T and 326F, the outputs are a+b. Here, if a=1, or b=1 or both, then the output is =1. If a=b=0, then the output is =0. Based on the signals inputs, the multiplexer 320 outputs dual-rail NCF signals "data" or "scan_in" as noted in FIG. 3B and described below.

In the example of FIG. 3A, the multiplexers 320T and 320F each have two Boolean AND gates and a Boolean OR gate to receive outputs of the AND gates. The multiplexer 320 has a Boolean inverter 328 tied to the single rail "shift_en" input so that both "shift_en" and the inverse of "shift_en" can be sent to the AND gates. In this case, the first Boolean AND gate 322T receives the "t_data" and the inverse of "shift_en"; second Boolean AND gate 324T receives the "t_scan_in" and the shift_en"; third Boolean AND gate 322F receives the "f_data" and the inverse of "shift_en"; and fourth Boolean AND gate 324F receives the "f_scan_in" and the shift_en". The output of the first two AND gates 322T and 324T are inputs or Boolean OR gate 326T; and the output of the third and fourth AND gates 322F and 324F are inputs or Boolean OR gate 326F.

Multiplexer 320T selects "t_data" when "shift_en" is not asserted (i.e. during normal operation or use of latch 330) and selects "t_scan_in" when "shift_en" is asserted (i.e. during scan or testing of latch 330). Similarly, multiplexer 320F selects "f_data" when "shift_en" is not asserted and selects "f_scan_in" when "shift_en" is asserted.

While multiplexer 320 is shown with the Boolean logic inverter 328, and AND-OR multiplexers 320T, 320F, it is considered that various other single rail controlled Boolean logic can be used in place of those elements to perform the same function of selecting between outputting the received dual-rail DIAL logic signals "data" or "scan_in". For instance, while the multiplexers 320T, 320F are shown implemented with AND-OR logic, any type of two-input Boolean multiplexer may be used to have single rail "shift_en" control whether dual-rail DIAL "t_data" or "t_scan_in" is output. Such alternative Boolean logic may include Boolean AND, OR, NOR, XOR, NAND and the like Boolean gates.

FIG. 3B shows an example truth table 390 for the inputs and outputs of the Boolean multiplexer 320 of FIG. 3A. Table 390 may summarize the operation of the circuits of FIG. 3A.

Table 390 shows Boolean inputs of single-rail binary values (shift_en) as (SHE). Table 390 also shows true "t" and false "f" inputs of dual-rail DIAL values (t_data, f_data) and (t_scan_in, f_scan_in) as (tDA, fDA), and (tSC, fSC), respectively. Each dual-rail may have three possible values: (0,0)=null, (1,0)=one, and (0,1)=zero, with (1,1) being illegal. It also shows the "Output" of the multiplexer 320 as true "t" and false "f" output dual-rail DIAL values (tMux, fMux). In table 390, "x" represents an irrelevant value or any value (e.g., 1 or 0). In table 390, "null" represents the null value output, which is (0,0) that results from a null value (0,0) input. In table 390, "ill" represents an illegal or unused value output that results from an illegal value (1,1) input. The illegal value input causes no change in the output. In table 390, there are not any illegal and null values for "shift_en" because it is only Boolean 1 or 0 for which illegal and null values do not exist. Table 390 shows that the Boolean logic values for the shift enable input ("shift_en") can be a single-rail selector input to control whether multiplexer 320 will output either DIAL values "data" or "scan_in" to the latch 330.

As compared to circuit 100 of FIG. 1A, the multiplexer 320 of FIG. 3A will add propagation delay, power consumption and chip area of the multiplexer 320 added in circuit 300. However, the multiplexer 320 can perform the same function as the multiplexer 220 with significantly smaller chip area, propagation delay, and power consumption.

First, the Boolean multiplexer 320 results in a smaller chip area and less power using multiplexer than multiplexer 220. The two Boolean AND OR multiplexers 320T and 320F have fewer circuit components or elements than that of the threshold gates of multiplexer 220. In some cases, the two Boolean multiplexers 320T, 320F take up less horizontal footprint area in the chip containing circuit 300 than the TH33W2 and THXOR gates of multiplexer 220 do in the chip containing circuit 200.

Also, by having single-rail Boolean value "shift_en", multiplexer 320 avoids having dual-rail, DIAL values (t_shift_en, f_shift_en) which cause many of the elements of the multiplexer 220 to switch cyclically as the self-timed processor of FIG. 2A cycles between the propagate data and propagate null phases. Not switching cyclically between the propagate data and propagate null phases allows the multiplexer 320 to have less propagation delay than the multiplexer 220. In addition, the unnecessary cycling of the DFT circuitry of multiplexer 220 may result in significant wasted power consumption as compared to that of multiplexer 320 having single-rail Boolean value "shift_en".

For example, during use of latch 330, having the Boolean logic and Boolean value "shift_en" in the multiplexer 320, instead of the dual-rail version, allows multiplexer 320 to be transparent to other logic of circuit 300 and to only toggle as the next state for data changes. In the multiplexer 320, "shift_en" can maintain a single Boolean value (e.g., of (0)) during use of the latch, thus avoiding switching cyclically between the propagate data and propagate null phases used by the multiplexer 220.

During testing of latch 330, having the Boolean logic and Boolean value "shift_en" in multiplexer 320, instead of the dual-rail version, allows the single rail value of "shift_en" to be static for long periods of time (e.g., long scan clock cycles) so that the test pattern "scan_in" can be passed into the latch 330. Here, "shift_en" can maintain a single Boolean value (e.g., of (1)) during passing of the test pattern into the latch during a long scan clock cycle (e.g., relative to use data clock cycles). After the test pattern is accepted by the latch 330, "shift_en" can be flopped to a single Boolean value (e.g., of (0)) to cause the latch 330 to output data to be captured and compared to expected results for the test pattern input to determine if the latch 330 is operating properly. The capturing and comparing can be performed by a tester device that is external to the processor or chip having circuit 300, such as is described above for circuit 105. This process of toggling "shift_en" between the Boolean values can be repeated as sequential dual-rail DIAL values of "scan_in" are cycled into the latch 330 and the output of the latch is captured to test the latch. Here, "shift_en" can toggle between two Boolean values (e.g., of (1) and (0)) during testing of the latch, thus avoiding switching cyclically between the propagate data and propagate null phases used by the multiplexer 220.

Moreover, this process of using single rail "shift_en" in circuit 300 can be compared to circuit 200 needing to toggle dual-rail DIAL logic "shift_en" and threshold gates of multiplexer 220 every single cycle, such as through a large buffer tree inputting it to multiplexer 220 (and other similar multiplexers of other circuits 200 of the processor). Thus, circuit 200 requires more time and power to perform the toggling every single cycle and passing of the dual rail "shift_en" through the buffer to multiplexer 220 than what is needed by multiplexer 320. This also requires more chip real estate for the additional circuitry of the large buffer tree inputting it to multiplexer 220 and threshold gates of multiplexer 220 than what is needed by multiplexer 320.

The structure of the asynchronous processor that is or includes circuit 200 or 300 is exemplary and an asynchronous processor may contain fewer than, or more than, three functional blocks, which may be interconnected in a variety of ways other than a simple pipeline. In general, each functional block in an asynchronous processor provides data to and/or receives data from at least one other functional block. Further, each functional block provides an acknowledge signal to and/or receives an acknowledge signal from at least one other functional block. Typically, each function block provides its acknowledge signal to other function blocks from which it receives data, and each function block receives an acknowledge signal from other function blocks to which it provides data

CLOSING COMMENTS

Throughout this description, the embodiments and examples shown should be considered as exemplars, rather than limitations on the apparatus and procedures disclosed or claimed. Although many of the examples presented herein involve specific combinations of method acts or processor elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A self-timed processor comprising:
combinatorial logic comprising multi-rail delay insensitive asynchronous logic (DIAL) to output one or more multi-rail data values to a multiplexer;
a test pattern input to output a test pattern bit stream of multi-rail test values to the multiplexer;
the multiplexer comprising Boolean logic to output one or more multi-rail multiplexed values to a latch, the multiplexer having a single rail selector input to select whether the multi-rail multiplexed values are the multi-rail data values or the multi-rail test values;
the Boolean logic comprising:
a first multiplexer logic that is I) a first Boolean AND gate to receive a) a first-rail input of the multi-rail data values, and b) an inverse of a first Boolean input from the single rail selector input; II) a second Boolean AND gate to receive a) a first-rail input of the multi-rail test values, and b) the first Boolean input from the single rail selector input; and III) a Boolean OR gate to receive outputs of the first and second Boolean AND gates of the first multiplexer logic; and
a second multiplexer logic that is I) a first Boolean AND gate to receive a) a second-rail input of the multi-rail data values, and b) the inverse of the first Boolean input from the single rail selector input; II) a second Boolean AND gate to receive a) a second-rail input of the multi-rail test values, and b) the first Boolean input from the single rail selector input; and III) a Boolean OR gate to receive outputs of the first and second Boolean AND gates of the second multiplexer logic.

2. The self-timed processor of claim 1, further comprising the latch, the latch comprising multi-rail delay insensitive asynchronous logic (DIAL) to receive the multi-rail multiplexed values.

3. The self-timed processor of claim 2, wherein the latch comprises flip-flops or storage elements for storing the multi-rail multiplexed values.

4. The self-timed processor of claim 3, wherein the latch includes multi-rail delay insensitive asynchronous logic (DIAL) to output one or more multi-rail data values based on the stored multi-rail multiplexed values.

5. The self-timed processor of claim 1, wherein the test pattern bit stream comprises a sequence of predetermined serial test pattern of multi-rail test data values.

6. The self-timed processor of claim 1, wherein the combinatorial logic and latch include threshold gates.

7. The self-timed processor of claim 1, wherein the test pattern input is configured to receive data from a source external to the processor.

8. An asynchronous processor comprising:
combinatorial logic comprising delay insensitive asynchronous logic (DIAL) to output one or more dual-rail data values to a multiplexer;
a test pattern input to output a test pattern of dual-rail test values to the multiplexer;
the multiplexer comprising an inverter and Boolean logic to output one or more dual-rail multiplexed values to a latch, the multiplexer having a Boolean value selector input to select whether the dual-rail multiplexed values are the dual-rail data values or the dual-rail test values;
the Boolean logic comprising:
a first multiplexer logic that is I) a first Boolean AND gate to receive a) a first-rail input of the dual-rail data values, and b) an inverse of a first Boolean input from the Boolean value selector input; II) a second Boolean AND gate to receive a) a first-rail input of the dual-rail test values, and b) an inverse of the first Boolean input from the Boolean value selector input; and III) a Boolean OR gate to combine outputs of the first and second Boolean AND gates of the first multiplexer logic; and
a second multiplexer logic that is I) a first Boolean AND gate to receive a) a second-rail input of the dual-rail data values, and b) the inverse of the first Boolean input from the Boolean value selector input; II) a second Boolean AND gate to receive a) a second-rail input of the dual-rail test values, and b) the first Boolean input from the Boolean value selector input; and III) a Boolean OR gate to combine outputs of the first and second Boolean AND gates of the second multiplexer logic.

9. The asynchronous processor of claim 8, wherein the combinatorial logic and latch include threshold gates.

10. The asynchronous processor of claim 8, wherein the test pattern input is configured to receive data from a source external to the processor.

11. A method of processing data within a self-timed processor, comprising:
receiving one or more multi-rail DIAL data values;
receiving a test pattern bit stream of multi-rail DIAL test values; and
selecting to output the multi-rail DIAL data values to use a latch or the multi-rail test values to test the latch based on a single rail selector input,
wherein selecting includes:
first multiplexer logic I) first Boolean AND gating a) a first-rail input of the multi-rail DIAL data values, and b) an inverse of a first Boolean input from the single rail selector input; II) second Boolean AND gating a) a first-rail input of the multi-rail DIAL test values, and b) the first Boolean input from the single rail selector input; and III) Boolean OR gating only outputs of the first and second Boolean AND gates of the first multiplexer logic; and
second multiplexer logic I) first Boolean AND gating a) a second-rail input of the multi-rail DIAL values, and b) the inverse of the first Boolean input from the single rail selector input; II) second Boolean AND gating a) a second-rail input of the multi-rail DIAL test values, and b) the first Boolean input from the single rail selector input; and III) Boolean OR gating only outputs of the first and second Boolean AND gates of the second multiplexer logic.

12. The method of claim 11, further comprising receiving the single rail selector input.

13. The method of claim 11, wherein selecting comprises:
receiving at the first multiplexer logic a) the first-rail inputs of the multi-rail DIAL data values and of the multi-rail DIAL test values, and b) the Boolean inputs based on the single rail selector input; and
receiving at the second multiplexer logic a) the second-rail inputs of the multi-rail DIAL data values and of the multi-rail DIAL test values, and b) the Boolean inputs based on the single rail selector input.

14. The method of claim 11, further comprising:
outputting the selected multi-rail DIAL data values or multi-rail DIAL test values to a latch as one or more multi-rail multiplexed values; and
receiving the multi-rail multiplexed values at the latch.

15. The method of claim 14, further comprising:
storing the received the multi-rail multiplexed values in multi-rail delay insensitive asynchronous logic (DIAL) of the latch; and
outputting one or more multi-rail data values based on the stored multi-rail multiplexed values.

16. The method of claim 11, wherein receiving the test pattern bit stream comprises receiving a sequence of predetermined serial test pattern of multi-rail test data values from a source external to the processor.

* * * * *